United States Patent [19]

Misic et al.

[11] Patent Number: 4,793,356

[45] Date of Patent: Dec. 27, 1988

[54] SURFACE COIL SYSTEM FOR MAGNETIC RESONANCE IMAGING

[75] Inventors: George J. Misic, Hiram; Gregory C. Hurst, Shaker Hts.; G. Neil Holland, Chagrin Falls; John L. Patrick, III, Solon; Paul T. Orlando, Euclid, all of Ohio

[73] Assignee: Picker International, Inc., Highland Hts., Ohio

[21] Appl. No.: 765,708

[22] Filed: Aug. 14, 1985

[51] Int. Cl.⁴ ............................................. A61B 5/05
[52] U.S. Cl. ................................. 128/653; 324/318; 324/322
[58] Field of Search ............... 128/653, 798, 1.3–1.5; 324/307, 309, 318, 322, 300; 343/741, 742

[56] References Cited

U.S. PATENT DOCUMENTS

| | | | |
|---|---|---|---|
| 2,110,392 | 3/1938 | Dorr | 128/798 |
| 2,882,904 | 4/1959 | Rasmussen | 128/798 |
| 3,340,867 | 9/1967 | Kubicek et al. | 128/713 |
| 3,662,757 | 5/1972 | Blackett | 128/798 |
| 4,095,168 | 6/1978 | Hlauka | 324/322 |
| 4,260,990 | 4/1981 | Lichtblau | 343/742 |
| 4,342,999 | 8/1982 | Woodward et al. | 343/742 |
| 4,397,041 | 8/1983 | Takeda et al. | 343/742 |
| 4,509,535 | 4/1985 | Bryan | 128/798 |
| 4,534,358 | 8/1985 | Young | 128/653 |
| 4,545,384 | 10/1985 | Kawachi | 128/653 |
| 4,592,363 | 6/1986 | Krause | 128/653 |
| 4,617,936 | 10/1986 | Malko | 128/653 |
| 4,634,980 | 1/1987 | Misic et al. | 324/322 |
| 4,649,348 | 3/1987 | Flugan | 324/318 |
| 4,672,972 | 6/1987 | Berke | 128/653 |
| 4,680,549 | 7/1987 | Tanttu | 324/318 |
| 4,707,662 | 11/1987 | Kemner et al. | 324/318 |

FOREIGN PATENT DOCUMENTS

| | | | |
|---|---|---|---|
| 2404100 | 9/1974 | Fed. Rep. of Germany | 324/318 |
| 0361722 | 4/1983 | U.S.S.R. | 324/307 |
| 2149124 | 6/1985 | United Kingdom . | |
| 2151791 | 7/1985 | United Kingdom . | |

Primary Examiner—Ruth S. Smith
Attorney, Agent, or Firm—Fay, Sharpe, Beall Fagan, Minnich & McKee

[57] ABSTRACT

A resonance exciting coil (C) excites magnetic resonance in nuclei disposed in an image region in which a main magnetic field and transverse gradients have been produced. A flexible receiving coil (D) includes a flexible plastic sheet (40) on which one or more loops (20) are adhered to receive signals from the resonating nuclei. Velcro straps (46) strap the flexible sheet and the attached coil into close conformity with the surface of the portion of the patient to be imaged. An impedance matching or coil resonant frequency adjusting network (50) is mounted on the flexible sheet for selectively adjusting at least one of an impedance match and the peak sensitivity resonant frequency of the receiving coil. A preamplifier (52) amplifies the received signals prior to transmission on a cable (24). A selectively variable voltage source (70) applies a selectively adjustable DC bias voltage to the cable for selectively adjusting at least one of the impedance match and the LC resonant frequency of the receiving coil. The received signals are amplified by an amplifier (82) and processed by an image processor (30) to form man-readable images of the examined region of the patient for display on a video display (32) or the like.

7 Claims, 6 Drawing Sheets

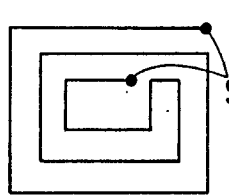
FIG.4E
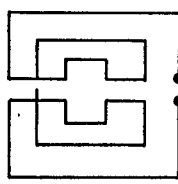
FIG.5E
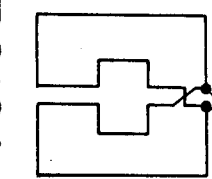
FIG.6E
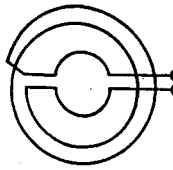
FIG.4D
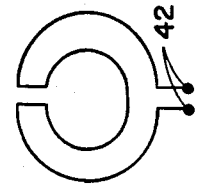
FIG.5D
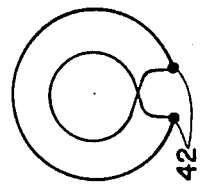
FIG.6D
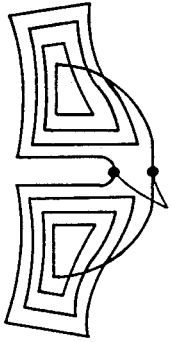
FIG.4C
FIG.5C
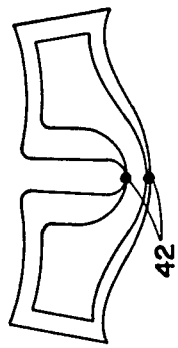
FIG.6C
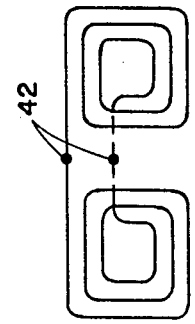
FIG.4B
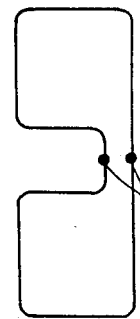
FIG.5B
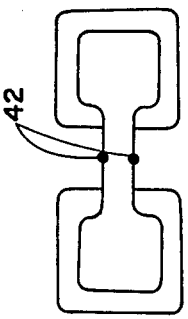
FIG.6B
FIG.4A
FIG.5A
FIG.6A

SURFACE COIL SYSTEM FOR MAGNETIC RESONANCE IMAGING

BACKGROUND OF THE INVENTION

The present invention relates to the art of magnetic resonance spectroscopy. More particularly, the present invention relates to coils for receiving electromagnetic signals from resonating nuclei. Although the present invention finds application in the field of medical imaging, it is to be appreciated that the invention also finds utility in other magnetic resonance applications, such as well logging, chemical analysis, and the like.

Heretofore, there have been two primary categories of receiving coils for magnetic resonance imaging and spectroscopy of selected body areas of the patient. First, a standard sized whole body coil or body portion receiving coil was dimensioned to be disposed around the portion of the patient to be imaged. Due to the standard sizing, a significant void or empty region was defined between the coil and the portion of the patient to be imaged. As the imaged portion of the patient became a smaller fraction of the coil volume, the signal-to-noise ratio was decreased, degrading the image quality. Further, the standard sized coils included no means to eliminate or reduce aliasing in two or three dimensional Fourier transform sequences.

The other type of receiving coil was formed by wrapping wire or other conductors on flat, rigid sheets of plastic or nylon. The flat coils were constructed in a variety of sizes to facilitate being positioned adjacent an area of the patient to be imaged. However, their planar nature permitted only limited, partial contact with the patient.

The rigid, standard sized body and body portion coils and the rigid, planar coils did not permit optimization of image quality. Rather, the lack of conformity with the patient failed to optimize the filling factor decreasing the signal-to-noise ratio. These rigid coils received resonance signals from over a significantly larger area than the region of interest. This sensitivity to extraneous information degraded spatial resolution and increased aliasing in two and three dimensional Fourier transform methodology. Improvement in the homogeneity of receiver sensitivity across the imaged space sacrificed the quality or Q factor of the coil, particularly in coils having resonance frequencies above 20 MHz. Moreover, the rigid coils were difficult to apply to the patient, uncomfortable, and created a need for a large range inventory of coil sizes.

Other problems have been encountered in transferring the signal received by the high impedance coil over low impedance transmission lines to a remote, out of the image region preamplifier. To minimize signal loss and noise, the length of the low impedance transmission line was minimized. Although short unmatched transmission lines functioned acceptably at low frequencies, the Q factor of the coil degraded rapidly with increasing frequency and cable length.

Matching the transmission line length to the wave length at the operating frequency resulted in excessive length at low and mid-field strengths and lines that were too short at high fields. Because the coil impedance greatly exceeded the transmission line impedance, high cable losses attributable to standing waves on the cable were experienced. Moreover, non-zero cable dielectric and conductor losses damped the surface coil.

Attempting to match the impedance of the transmission line, whether balanced or unbalanced, has been unsuccessful. The normal variations in patient loading caused a corresponding impedance mismatch and resultant power transfer loss. At mid and high magnetic field strengths the patient loading mismatch and transmission loss were magnified.

The present invention provides a new and improved coil and coil signal transmission system which overcomes the above reference problems and others.

SUMMARY OF THE INVENTION

In accordance with one aspect of the present invention, a flexible receiving coil is provided for magnetic resonance imaging. A sheet of flexible material is configured to conform to a selected surface portion of an examined patient. A retaining means, such as velcro or tie straps, selectively retains the flexible sheet in conformity with the selected patient surface portion. An electrically conductive foil is adhered to the flexible sheet in a selected coil pattern. At least one electrical component is mounted on the flexible plastic sheet in an electrically conductive relationship with the conductive foil to enhance the receipt of radio frequency signals thereby.

In accordance with another aspect of the present invention, a receiving coil is provided for receiving radio frequency signals form resonating nuclei. The coil includes first and second electrically conductive loops. The loops are connected electrically in parallel such that the inductance of the parallel connected loops is less than the inductance of either of the first or second loops alone. The loops are configured to be disposed adjacent the resonating nuclei to receive the radio frequency signals therefrom.

In accordance with another aspect of the present invention, an apparatus for receiving radio frequency signals from resonating nuclei is provided. An electrically conductive coil is configured to be disposed adjacent the resonating nuclei. A resonant frequency adjusting means selectively adjusts the resonant frequency of the coil. The resonant frequency adjusting means is mounted to the coil to be disposed adjacent the resonating nuclei therewith. A conductive lead extends from the loop coil and the frequency adjusting means to a remotely located signal processing circuit. A resonant frequency control means selectively controls the resonant frequency adjusting means for selectively controlling adjustment of the coil resonant frequency. The resonant frequency control means is operatively connected with the conductive lead adjacent the remotely located processing circuit.

In accordance with another aspect of the present invention, a impedance coil is configured to be disposed adjacent resonating nuclei. A non-ferrous, high impedance preamplifier is mounted closely adjacent the coil within a magnetic field for resonating the nuclei.

In accordance with a more limited aspect of the embodiment, remotely located control means are provided for selectively adjusting at least one of the impedance and the resonant frequency of the coil.

In accordance with yet another aspect of the present invention, a magnetic resonance imaging apparatus is provided. The apparatus includes a main magnetic field generating means for generating a main magnetic field longitudinally along an imaging region. A gradient field means selectively produces magnetic field gradients across the main magnetic field in the imaging region. A magnetic resonance means excites magnetic resonance in nuclei of a patient disposed in the imaging region. A flexible coil is disposed in conformity with a surface portion of the patient to receive radio frequency signals from th resonating nuclei thereadjacent. An image reconstruction means for reconstructing an image representative of resonating nuclei position and density is operatively connected with the flexible coil.

A primary advantage of the present invention is that it provides an improved filling factor and a higher signal-to-noise radio.

Another advantage of the present invention is that it reduces and controls the regions of sensitivity.

Yet another advantage of the present invention resides in the reduction or elimination aliasing, particularly in localized imaging with an expanded field of view during two and three dimensional Fourier transform processing of the receiving signals.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating preferred embodiments of the invention and are not to be construed as limiting it.

FIGS. 4A through E illustrate alternate embodiments of receiving coil patterns which are particularly adapted to receiving frequencies below 15 MHz;

FIGS. 5A through E illustrate alternate coil patterns which are particularly adapted to receiving signals in the 10 to 50 MHz range;

FIGS. 6A through E illustrate alternate coil patterns which are particularly adapted to receiving signals in the 25 to 200 MHz range;

DETAILED DESCRIPTION OF THE PREFERRED EMBODIMENTS

Figure 1:
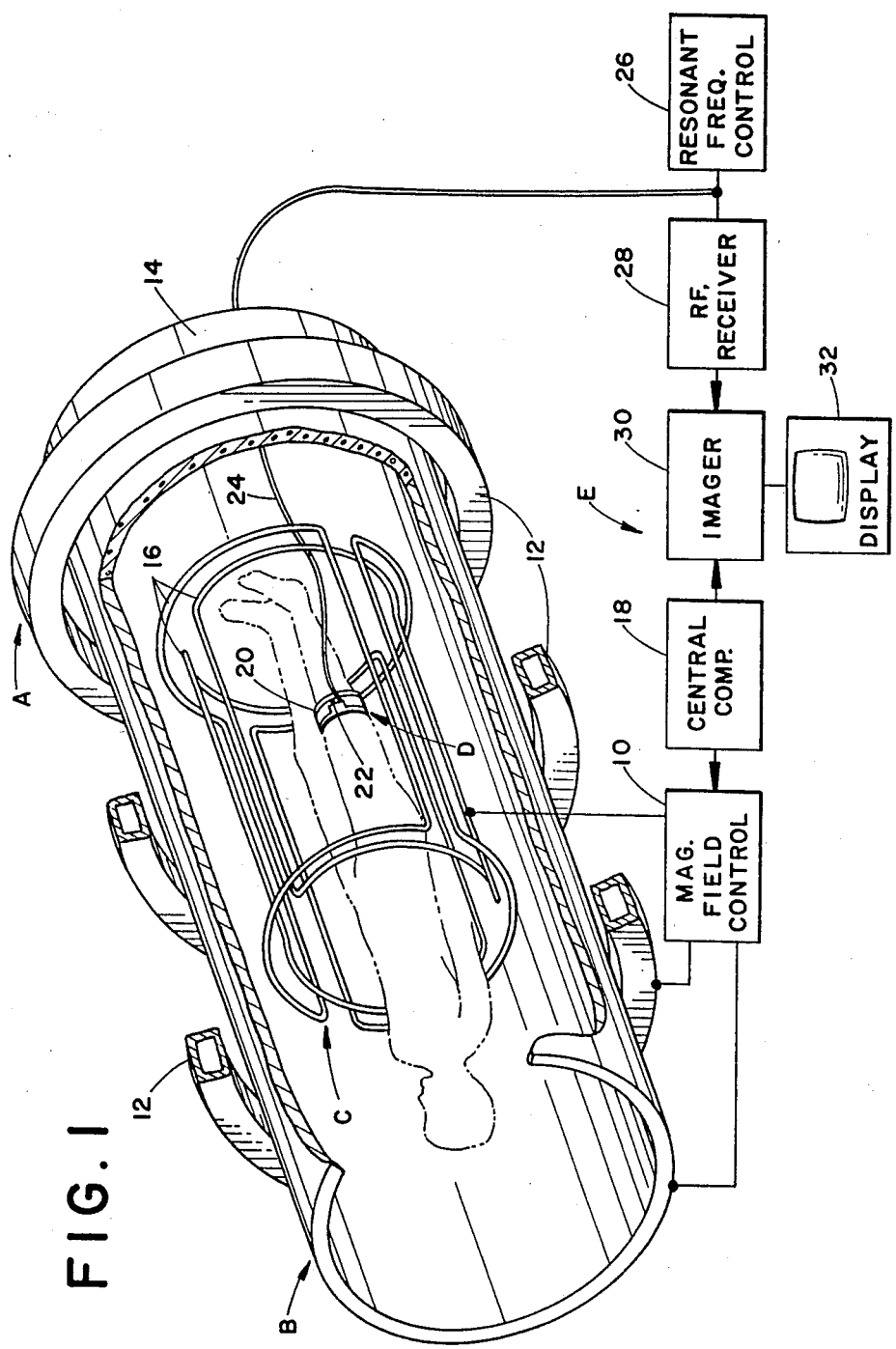
FIG. 1 is a diagramatic illustration of a magnetic resonance imaging apparatus incorporating the present invention.

With reference to FIG. 1, a magnetic resonance imaging apparatus includes a main magnetic field means A for establishing a generally uniform, main magnetic field extending longitudinally through an imaging region. A gradient field means B selectively produces magnetic fields gradients transversely across the main magnetic field in the image region. A magnetic resonance excitation means C selectively excites magnetic resonance in nuclei of a patient disposed in the image region. The resonating nuclei generate radio frequency signals of a frequency which is determined by the strength of the magnetic field thereadjacent and various system constants such as the gyromagnetic ratio of the nuclei. A flexible receiving coil D is disposed in conformtiy with a selected portion of the patient within the image region to receive radio frequency resonance signals from the resonating nuclei. Processing circuitry E converts the received radio frequency signals into a man-readable display representative of nuclei density, position, and the like.

More particularly, the main magnetic field means A includes a magnetic field control circuit 10 and a plurality of large, superconducting or other high power magnets 12. The magnetic field control circuit 10 also functions as a portion of the gradient field means B to control the angular orientation of the transverse gradient fields generated by a gradient field coil 14. The magnetic field control circuit 10 also causes transmission coils 16 of the resonance excitation means c to exite magnetic resonance with a controlled periodicity. A central computer 18 coordinates the generation of the main, gradient, and resonance exciting magnetic fields.

The flexible receiving coil D includes one or more coils of electrically conductive materials 20 and at least one electrical component 22 mounted therewith for enhancing receipt of resonance signals. In the preferred embodiment, the electrical component includes circuitry for adjusting the resonant frequency of the receiving coil 20 so as to match the frequency of the resonant signals and a pre-amplifier for boosting the magnitude of the received signals. A cable 24 connects the receiving coil 20 and the electrical components 22 with the remotely located processing circuitry E.

A resonant frequency control means 26 is connected with the cable 24 for selectively causing the electrical component 22 to adjust the resonant frequency of the receiving coil A radio frequency receiver 28 receives the resonance signals form the receiving coil. An imager 30 receives the resonance signals from the radio receiver 28 and magnetic field information and other control instructions from the central computer 18. The imager reconstructs a man-readable representation or image indicative of the position, density, resonant frequency, or other characteristics of the resonating nuclei for display on a video monitor or other man-readable display 32.

Figure 2:
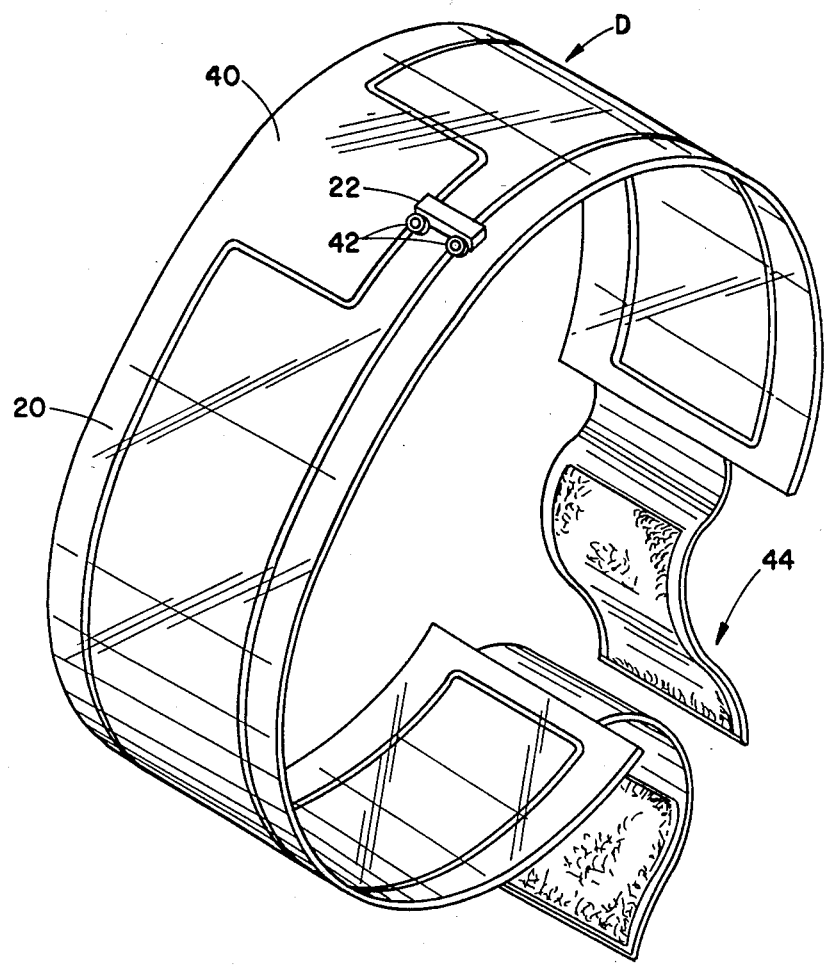
FIG. 2 is a coil construction in accordance with the present invention which is particularly adapted for conformity with a patient's knee.

With particular reference to FIG. 2, a preferred embodiment of the flexible coil D includes a sheet 40 of a flexible, non-paramagnetic material which is readily conformed to a patient's knee or other surface area of the patient adjacent an internal region to be imaged. The electrical loop coil 20 is formed of a copper foil which is attached or plated to a thin film of MYLAR, KAPTON, or like plastic films. The thin film is adhesively backed with a peel-off protective layer to facilitate cutting to the selected shape and adhering to the plastic sheet. A pair of sockets 42 connected with the coil 20 on the electrical components 22 facilitates interconnecting and removing the cable 24. The electrical components 22 are incorporated in a small assembly which is connected across the coil loops. A retaining means 44, such as a pair of VELCRO or other hook and loop connection fabric straps, are connected with the flexible plastic sheet for selectively retaining the flexible plastic sheet in conformity with the selected patient surface portion.

Figure 3:
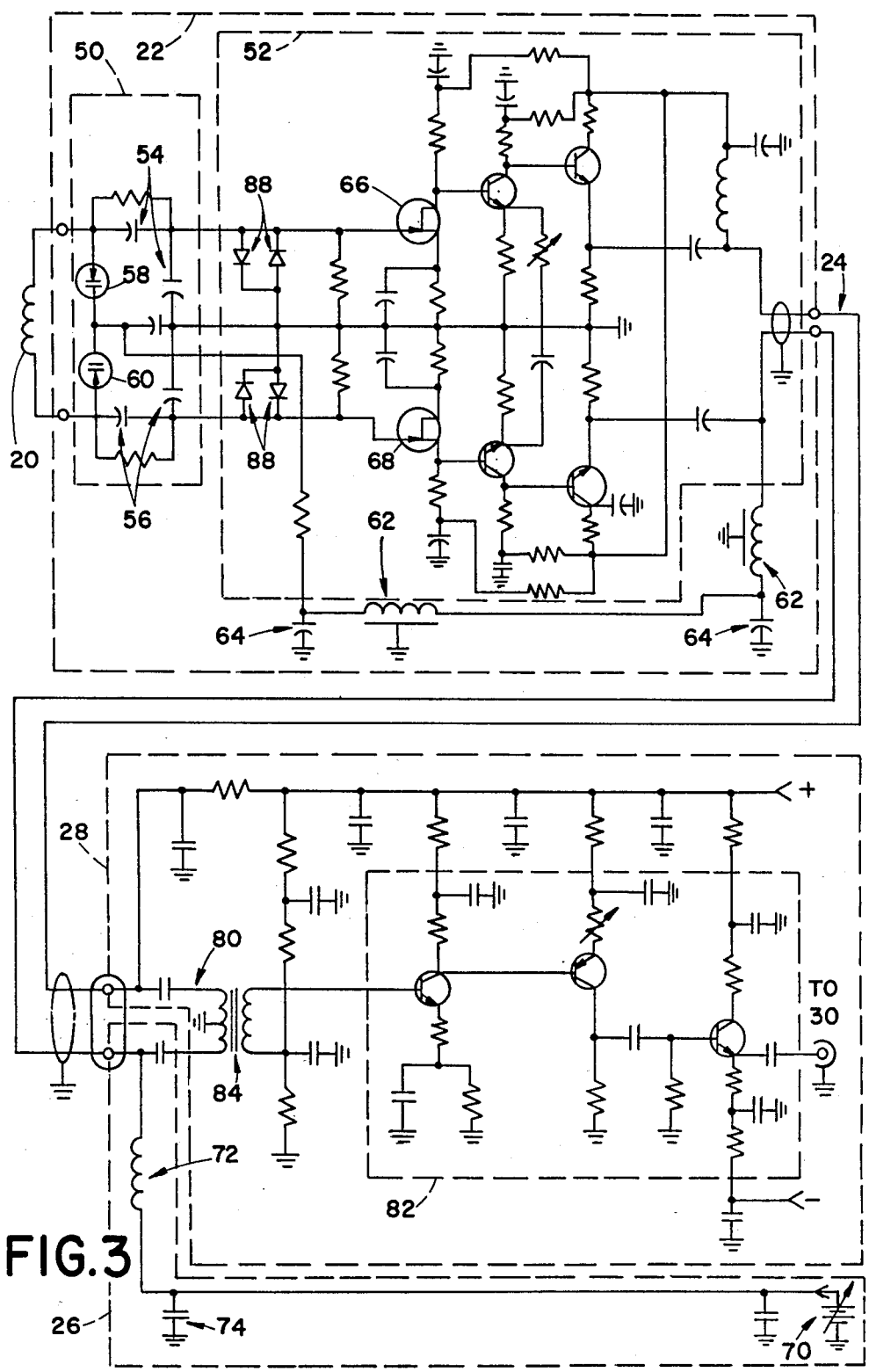
FIG. 3 is a diagramatic illustration of electrical circuitry which is mounted in part on the coil construction of FIG. 2 for matching or adjusting the resonant frequency of the coil and is in part remotely located for selectively causing the resonant frequency adjustment.

With reference to FIG. 3, the electrical component 22 includes an impedance matching or resonant frequency adjusting means or network 50 for selectively adjusting a resonant frequency of the receiving coil D. A preamplifier 52 boosts the amplitude of received resonance signals. The impedance adjusting network includes a pair of adjustable capacitor divider networks 54 and 56 each connected between one end of the receiver coil 20 and ground. The capacitor networks include variable capacitance means, such as varicap diodes or varactors 58, 60, for varying the capacitance of the network in response to an applied bias or control signal. A radio frequency choke 62 and a capacitive filter 64 remove non-DC signal components from a received capacitance control signal or bias voltage for varying the resonant frequency. The choke has a non-ferrous core to avoid saturation from the magnetic fields. Optionally, a parallel capacitor may be provided for resonating the choke at low frequencies without excessive DC resistance. The varicap diodes 58, 60 are connected between the respective ends of the receiving coil 20 and a signal ground. This change in potential varies the capacitance of an LC network formed by the coil 20 and the capacitive networks 54 and 56, particularly the varicap diodes 58, 60. Varying the capacitance varies the LC tuning of the capacitance networks and the receiver coil adjusting the resonant frequency thereof accordingly.

The preamplifier 52 has an input impedance which matches the high impedance of the receiving coil 20, typically about 20,000 ohms. The preamplifier is configured to provide an output which is capable of driving the cable 24, typically 100 ohm balanced twinaxial transmission line. A gain on the order of 15 dB is preferred. However, it is to be appreciated that the preamplifier characteristics are adjusted and selected for compatability with the attached receiving coil 20.

In the preferred embodiment, the preamplifier 52 includes a pair of high input impedance amplifiers 66, 68 in a push-pull configuration for boosting the resonance signal to drive it along the cable 24. In the preferred embodiment, the preamplifier has three direct coupled stages which minimizes size, component count, and complexity. The high input impedance first stage amplifiers 66, 68 are J-FET devices. Gain is controlled by adjusting the level of emitter bypassing available on the second amplifier stage. The third or output stage includes a push-pull emitter follower to provide low impedance to drive the low impedance cable 24. This impedance matching enables the cable 24 to extend substantial distances, such as the distance commonly encountered in well logging. Preferably, the cable 24 is an integer multiple of a half wave length cable such that the impedance adjacent the preamplifier and frequency adjusting circuit matches the impedance at the resonant frequency control circuit 26 and the radio frequency receiver 28.

The coil mounted electrical assembly 22 preferrably incorporates surface mounted components, although in the preferred embodiment the varicap diodes 58, 60 and the radio frequency chokes 62 are not. A high quality dielectric material is used as a substrate for printed circuitry in the assembly. Plated through holes are used to reach a primary ground plane of the assembly, opposite to the component side of printed circuit board. All components and materials have an extremely low ferrous content to avoid interference with and distortion of the magnetic fields. Preferably, all components and materials are non-ferrous. In the preferred embodiment, the assembly 22 is about 2 cm. by 3 cm. and 0.85 cm. thick.

The resonant frequency control means or circuit 26 includes an adjustable voltage source 70 which provides a selectively adjustable biasing voltage. A radio frequency choke 72 and a filter capacitor 74 separate the bias voltage from the resonance signals such that both can be conveyed superimposed on the cable 24.

The receiving circuit 28 includes a filter 80 for separating the radio frequency resonance signals from the DC resonant frequency adjusting bias. An amplification stage 82 and an isolation transformer 84 boost and convey the resonant frequency signals to the spectrometer. In the preferred embodiment, the signals are conveyed to the imager 30. However, it is to be appreciated that the spectrometer may process the spectrographic data to obtain other information, such as chemical composition.

When using linear polarization with separate transmit and receive coils, the transmit coil is commonly disposed orthogonally from the receive coil. With surface coils, this orthogonality is not always practical. The nature of conformal surface coils commonly prevents placement with the accuracy which is required to achieve transmit/receive isolation by orthogonality alone. To achieve decoupling of transmit and receive coils that are at least partially polarized in the same direction, the preferred embodiment uses passive diode switching. More specifically, passive crossed diodes ar placed in series with each of the coil feed points to effectively open circuit the transmit coil during receive. Alternately, the diodes may be connected such that the resonant frequency of coil is altered sufficiently to reduce coupling substantially during receive, e.g. switching a capacitor out of the coil circuit to raise the resonant frequency. Preferably, PIN diodes are used such that no portion of the radio frequency waveform is lost in biasing the diodes into a conductive state.

The receiving coil 20 is decoupled with crossed diode pairs 88 which are connected between the gates of the high input impedance amplifiers 66, 68 and ground. During transmit, a negative bias is applied to the tuning line which feeds the varactor diodes 58, 60. This biases the crossed diodes 88 into forward conduction reducing the available Q of the surface coil 20 and detuning the resonant point downward.

FIG. 4A illustrates a receiver coil pattern for coils in which a length of conductor extends between the electrical connection sockets 42 or the circuit chip 22 in a generally spiral pattern. This single spiral loop pattern is particularly adapted to resonant frequencies below 10 MHz, particularly 5.6 MHz and 6.4 MHz signals.

FIG. 4B illustrates a coil which is particularly adapted to be placed on extremities such as the patient's knee or neck. It includes a pair of spiral coil loops connected in parallel with each other to the sockets 42.

FIG. 4C illustrates a coil that is particularly adapted to receive 5.6 MHz and 6.4 MHz signals adjacent to the patient's neck. The neck coil includes two spiral pattern coils each shaped to conform to one side of the patient's neck passing around and over the patient's shoulders. Each spiral coil portion is generally a skewed trapezoid with parallel base and top edges that extend longitudinally along the front and back of the patient's neck and slightly curved sides which pass over the patient's shoulder and around the patient's jaw and ear.

FIG. 4D illustrates a coil pattern that is particularly adapted to focus signals adjacent a patient's inner ear. An inner most winding effectively circle in one direction while the two outer windings circle in the opposite direction to limit the area of sensitivity. This enables a received signal to be dominated by inner ear originating components rather than surrounding tissue. Analogously, transmitted signals are centrally focused.

FIG. 4E illustrates a winding pattern for examinations of the lumbar and thoracic spine regions. The inner most rectangular loop is surrounded by two outer loops which are wound in the opposite direction. This increases sensitivity to signal components originating in the spine and reduces components from surrounding tissue. Transmitted signals are similarly directed centrally.

FIGS. 5A through 5E illustrate winding patterns for coils which are adapted to be tuned to the 10-50 MHz range, particularly the 17 and 21 MHz frequencies. FIG. 5A illustrates a coil which is essentially a single loop. FIG. 5B illustrates bow-tie shaped coils which are particularly adapted for imaging extremities such as the patient's knee or elbow. A pair of single loop coils are connected with the sockets 42, i.e. in parallel with each other.

FIG. 5C illustrates a coil arrangement in which a pair of single loop generally skewed trapezoidal coils are connected in parallel with the sockets 42. Each skewed trapezoidal portion is configured essentially as in the outer ring of FIG. 4C such that the ends of each coil loop extend longitudinally along the front and back of the patient's neck and the side portions extend around and over the patient's shoulder and under and along the patient's jaw.

FIG. 5D is effectively two loops in series, each extending in opposite directions to focus received and transmitted signals centrally. FIG. 5E, like FIGURE 4E, is effectively three concentric rectangular loops connected in series with the central loop extending opposite to the outer loops.

FIG. 6A through 6E illustrate coils which are particularly adapted to operate above 50 MHz, particularly at 64 or 85 MHz. FIG. 6A illustrates a square coil which includes four concentric coil loops connected in parallel. FIG. 6B illustrates a coil arrangement which is particularly adapted for imaging extremities such as knees or elbows. A pair of concentric. parallel connected loops are connected in parallel with each other across the socket 42. In FIG. 6c, a first pair of generally skewed trapezoidal coils are configured to fit around one side of a patient's neck. A second, mirror image pair of skewed trapezoidal coils are connected in parallel with the first pair across the sockets 42 to fit around the other side of the patient's neck. In FIG. 6D, a pair of concentric loops are connected electrically in parallel with each other and arranged such that the current flows through each loop in the opposite direction. FIG. 6E illustrates a coil in which two loops are connected in parallel. The two loops are arranged to define two effective loops with the inner loop extending in an opposite direction to the outer loop.

It is to be appreciated that the illustrated coil constructions have application beyond flexible receiving coils. The patterns find application in fixed and rigid coil systems, such as head or body systems. Further, the illustrated coils may also be used for transmission. The coil patterns with oppositely extending windings to control the region of sensitivity are particularly advantageous in transmission systems.

Figure 7:
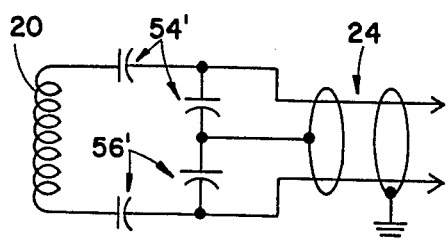
FIG. 7 is another alternate embodiment of coil mounted signal enhancement circuitry.

FIG. 7 illustrates an alternate frequency selection circuit. Capacitive networks 54' and 56' are sized to select the resonant frequency and impedance of the receiving coil 20.

Figure 8:
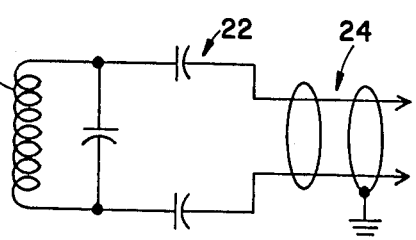
FIG. 8 is another alternate embodiment of coil mounted signal enhancement circuitry.

FIG. 8 illustrates another resonant frequency selection circuit. A network of capacitors are sized to match the LC resonant frequency of the receiving coil 20 to a selected resonant frequency and impedance.

Figure 9:
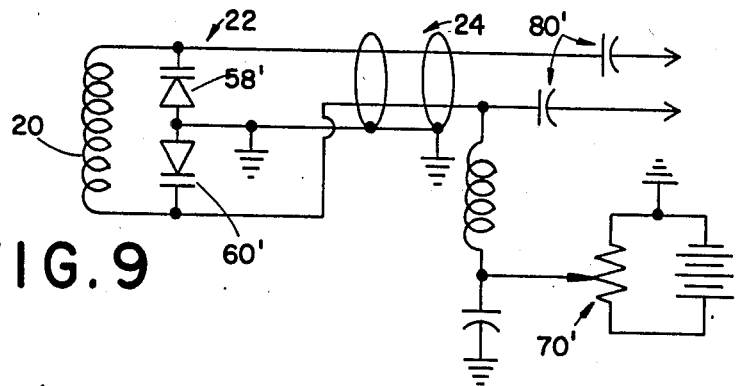
FIG. 9 is an alternate embodiment of a remotely controlled coil mounted resonant frequency adjusting circuit.

FIG. 9 illustrates an alternate embodiment to the remote frequency adjusting system of FIG. 3 which is particularly adapted for resonant frequencies in the 10-50 MHz range. A variable voltage source 70' applies a variable voltage to the connecting cable 24. The receiving coil 20 is connected with a pair of varicap diodes 64', 66' which are grounded at a common interconnection. The variable voltage is applied unevenly across the varicap diodes to alter the impedance, particularly the capacitance, hence the resonant frequency characteristics of the coil 20. A DC filter means 80' separates received radio frequency signals form the DC bias signal for further processing.

Figure 10A:
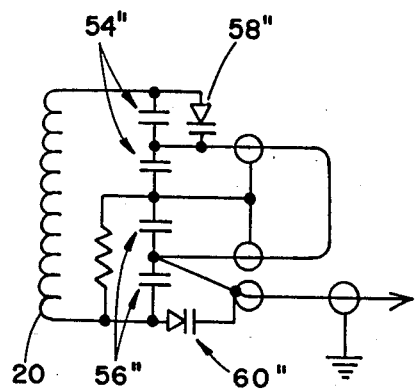
FIG. 10A, B and C are other alternate embodiments of coil mounted remotely controlled signal enhancement circuitry.
Figure 10B:
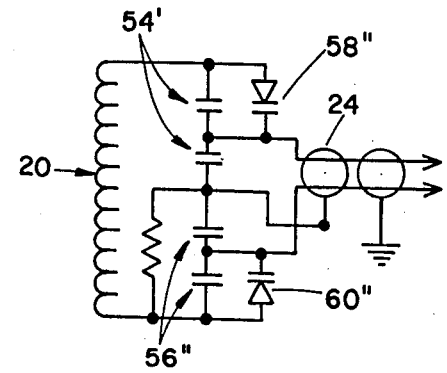
Figure 10C:
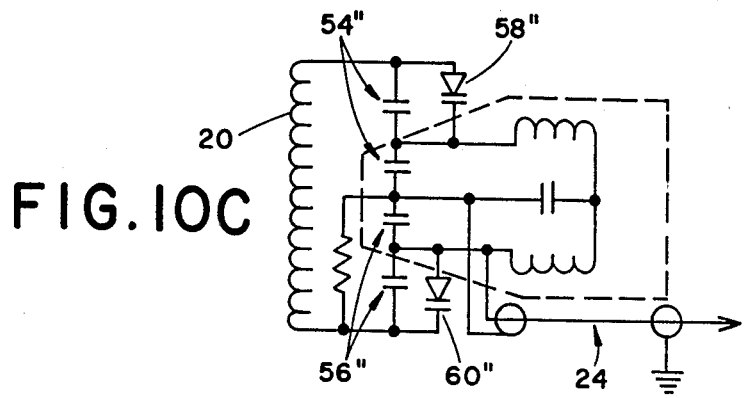

FIG. 10A, B and C illustrate yet another alternate embodiment of the electrical component assembly 22 which is particularly adapted to operation with resonant frequencies of 25-200 MHz. Each is selected to enhance one or more performance characteristics. Each assembly includes a pair of varicap diode 58'',60'' or other variable capacitance means which are connected with the receiving coil 20 to adjust the impedance, hence the resonant frequency thereof. A DC potential is selectively applied to the center conductor(s) of the cable 24 to adjust the capacitance and the resonant frequency.

Figure 11:
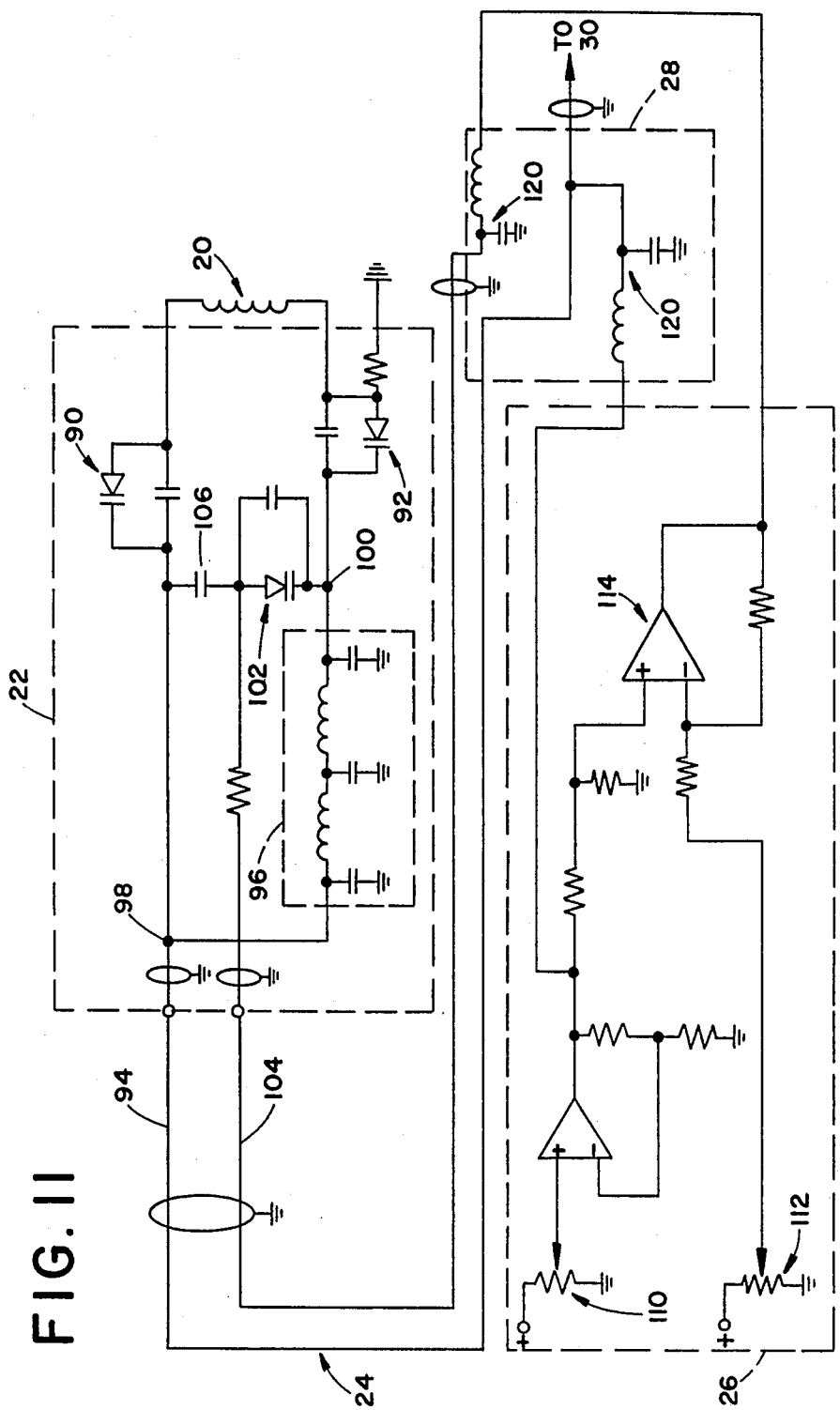
FIG. 11 is yet another alternate embodiment in which both the frequency and the impedance match are each separately and remotely adjustable.

In the embodiment of FIG. 11, the resonant frequency and the impedance match are independently and remotely adjustable. The on coil assembly 22 includes a pair of variable capacitance networks 90 and 92 interconnected with the receiving coil 20. One of the variable capacitance networks is connected directly with a tuning bias line 94 of the lead 24 and the other is connected with the tuning bias line through a balun assembly 96. Feed points 98, 100 are defined at opposite ends of the balun assembly.

A third variable capacitance network 102 is connected between an impedance matching bias line 104 of the lead 24 and one of the feed points 100. A fixed capacitance 106 is connected between the matching bias line and the other feed point 98.

The control circuit 22 includes a resonant frequency adjusting means 110 which applies a selectively adjustable DC bias to the tuning bias line 94. An impedance match adjusting means 112 applies a selectively adjustable DC bias to the impedance matching bias line 104. A subtraction means 114 subtractively combines the tuning and impedance matching DC biases to minimize the effect of one of the bias adjustments on the other.

In this manner, the DC bias applied to the tuning bias line 94 selectively adjusts the total capacitance applied across the receiving coil, hence the resonant frequency thereof. The DC bias on the impedance matching bias line 104 adjusts the capacitance of the third variable capacitance network 102, hence the ratio of the capacitances across the feed points 98, 100, i.e. the impedance match.

The receiving circuit 28 includes a DC filter 120 for separating the DC bias signal from the radio frequency resonance signals transmitted over the lead 24.

The invention has been described with reference to the preferred embodiments. Obviously, modifications and alterations will occur to others upon reading and understanding the preceding detailed description. It is intended that the invention be construed as including all such alterations and modifications in so far as they come within the scope of the appended claims or the equivalents thereof.

Having thus described the preferred embodiments, the invention is now claimed to be:

1. A magnetic resonance imaging apparatus comprising:
    a main magnetic field generating means for generating a main magnetic field longitudinally along an image region;
    a gradient field means for producing magnetic field gradients across the main magnetic field in the image region;
    a magnetic resonance excitation means for exciting nuclei of an object in the image region to resonate, the resonating nuclei generating radio frequency resonance signals;
    a flexible coil disposed in conformity with a selected surface portion of the object for at least receiving the resonance signals;
    a first variable capacitance means mounted to the flexible coil for selectively adjusting a resonant frequency thereof under control of a received resonance frequency adjusting signal;
    a second variable capacitance means operatively connected with the coil for selectively adjusting an impedance match thereof under control of an impedance adjusting signal;
    a common electrical conductor connected to the coil and the first and second variable capacitance means for concurrently conveying the resonance signals from the coil and resonance frequency and impedance adjusting signals to the first and second variable capacitance means;
    a control means connected to the electrical conductor for applying the resonant frequency and impedance adjusting signals thereto; and,
    an image reconstruction means for reconstructing a representation of an image of resonating nuclei position and density, the image reconstruction means being operatively connected with the electrical conductor.

2. A receiving apparatus for receiving radio frequency resonance signals from resonating nuclei in a magnetic resonance apparatus, the apparatus comprising:
    a radio frequency receiving coil means which is disposable in the magnetic resonance apparatus for receiving the resonance signals and including:
        a first electrically conductive loop;
        a second electrically conductive loop arranged concentrically with and connected electrically in parallel with the first loop such the inductance of the parallel connected loops is less than the inductance of the each of the first and second loops, the parallel connected first and second loops being configured to be disposed adjacent resonating nuclei to receive the resonance signals therefrom;
        a third conductive loop arranged concentrically with the first and second loops and electrically interconnected therewith by a signal combining means which subtractively combines a current signal induced in the third loop with current signals induced in the first and second loops;
    a preamplifier means operatively connected with the first and second conductive loops for amplifying the received resonance signals;
    a signal processing circuit connected with the preamplifier.

3. The apparatus as set forth in claim 2 further including a capacitive network operatively connected with the conductive loops such that the conductive loops and the capacitive network form an LC resonance circuit and a resonant frequency adjusting means operatively connected with the first and second loops and the capacitive network for adjusting the LC resonance frequency thereof.

4. A receiving apparatus for receiving radio frequency resonance signals from resonating nuclei which are excited to resonance within a magnetic resonance imager, the apparatus comprising:
    an electrically conductive coil which is selectively disposed in the magnetic resonance imager to receive the resonance signals;
    a preamplifier means mounted on the coil and electrically connected with the coil for amplifying the received resonance signals;
    a conductive lead extending from the preamplifier to a remotely located signal processing circuit for conveying the amplifier resonance signals thereto;
    an adjusting means for selectively adjusting at least one of a resonant frequency of the coil and an impedance match between the coil and the preamplifier means, the adjusting means being mounted on the coil and electrically connected with the conductive lead which carries the preamplified resonance signal from the preamplifier to the remotely located signal processing circuit, the adjusting means being selectively controlled by an adjustment signal received on the conductive lead for adjusting the at least one of the resonant frequency an the impedance match; and,
    a remotely located adjustment control means for selectively applying the adjustment signal to the control lead adjacent the remotely located processing circuit such that the same control lead is utilized both to convey resonance signals from the coil to the signal processing circuit and to convey adjustment signals form the remotely located control means to the coil.

5. The apparatus as set forth in claim 4 wherein the conductive lead is a triaxialy cable which has an outer, electrically conductive sheath that is connected to a fixed ground and two inner conductors, the resonance signal being conducted as a potential across the two inner conductors; and,
    wherein the adjusting means includes a resonant frequency adjusting means and an impedance matching adjustment means, the resonance frequency adjusting means and the impedance adjusting means each being operatively connected with a different two of the sheath and two inner conductors of the triaxial cable.

6. The apparatus as set forth in claim 4 wherein the preamplifier means includes an input transistor which has a high impedance and a reactive component, the input transistor being connected with the coil such that the reactive component of the transistor affects the resonant frequency of the coil.

7. A magnetic resonance apparatus comprising:

means for exciting nuclei in a preselected resonance region to resonance such that magnetic resonance signals are generated thereby;

a receiving coil for receiving magnetic resonance signals from only a preselected subregion of the preselected region, the receiving coil including:

a first conductive loop having first and second end portions and disposed in the resonance region generally around the sub-region such that the resonance signals from the subregion and portions of the resonance region around the subregion induce a first current signal in the first conductive loop flowing with a first polarity from the first end portion to the second end portion;

a second conductive loop having first and second end portions and extending around the first conductive loop such that resonance signals primarily of the resonance region portions around the subregion induce a second current signal in the second conductive loop flowing with the first polarity from the first end portion to the second end portion;

means for interconnecting the first loop first end portion with the second loop second end portion and interconnecting the first loop second end portion with the second loop first end portion to interconnect the first and second loops in an anti-parallel relationship such that the first and second current signals are subtractively combined to produce a difference signal, whereby the resonance signals form the subregion and the resonance region portion around the subregion received by the first loop and the resonance signal primarily from the resonance region portions around the subregion received by the second loop are subtractively combined to cancel the resonance signals from the resonance region portion surrounding the subregion;

a signal processing means processing the difference signal, the signal processing means being operatively connected with the interconnecting means.

* * * * *